(12) United States Patent  
Miyanari

(10) Patent No.: US 9,010,343 B2  
(45) Date of Patent: Apr. 21, 2015

(54) CLEANING DEVICE, CLEANING METHOD, AND COMPOSITION

(75) Inventor: Atsushi Miyanari, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 831 days.

(21) Appl. No.: 13/196,306

(22) Filed: Aug. 2, 2011

(65) Prior Publication Data

US 2012/0031443 A1 Feb. 9, 2012

(30) Foreign Application Priority Data

Aug. 6, 2010 (JP) .................................. 2010-177988

(51) Int. Cl.
| | | |
|---|---|---|
| *B08B 3/00* | (2006.01) | |
| *C09D 129/04* | (2006.01) | |
| *B08B 3/02* | (2006.01) | |
| *H01L 21/02* | (2006.01) | |
| *H01L 21/67* | (2006.01) | |
| *H01L 21/683* | (2006.01) | |

(52) U.S. Cl.
CPC ............ *B08B 3/02* (2013.01); *H01L 21/02057* (2013.01); *H01L 21/67051* (2013.01); *H01L 21/67132* (2013.01); *H01L 21/6835* (2013.01); *H01L 21/6836* (2013.01); *H01L 2221/68327* (2013.01); *H01L 2221/68381* (2013.01); *Y10S 134/902* (2013.01)

(58) Field of Classification Search
CPC ............... B08B 3/02; H01L 21/02057; H01L 21/67051; H01L 21/6835; H01L 21/6836; H01L 21/67132; H01L 2221/68381; H01L 2221/68327
USPC ...................................... 134/94.1, 115 R, 902
See application file for complete search history.

(56) References Cited

U.S. PATENT DOCUMENTS

| | | | | |
|---|---|---|---|---|
| 3,221,079 | A * | 11/1965 | Harris | 525/58 |
| 3,391,024 | A * | 7/1968 | Pierce | 427/62 |
| 6,998,571 | B2 | 2/2006 | Sekiya et al. | |
| 7,084,063 | B2 * | 8/2006 | Noguchi et al. | 438/691 |
| 2003/0057595 | A1 * | 3/2003 | Tsujimoto | 264/217 |
| 2004/0112880 | A1 | 6/2004 | Sekiya | |
| 2004/0211762 | A1 | 10/2004 | Sekiya et al. | |
| 2005/0110186 | A1 * | 5/2005 | Tsujimoto | 264/216 |
| 2010/0137180 | A1 * | 6/2010 | Maessen et al. | 510/171 |

FOREIGN PATENT DOCUMENTS

| | | |
|---|---|---|
| JP | 8-64558 | 3/1996 |
| JP | 8-186087 | 7/1996 |
| JP | 2004-188475 A | 7/2004 |
| JP | 2004-322168 A | 11/2004 |
| JP | 2005-302805 | 10/2005 |
| JP | 2008-140909 | 6/2008 |

* cited by examiner

OTHER PUBLICATIONS

Office Action issued Jun. 10, 2014 in corresponding Japanese Application No. 2010-177988.

*Primary Examiner* — Michael Barr  
*Assistant Examiner* — Benjamin L Osterhout  
(74) *Attorney, Agent, or Firm* — Knobbe Martens Olson & Bear LLP

(57) ABSTRACT

A cleaning device for cleaning a substrate adhering to a support film, including a protective film forming measure for forming a protective film on an exposed surface of the support film, wherein the exposed surface is a portion of a surface of the support film to which a first surface of the substrate adheres, but the substrate does not adheres to the exposed surface; and a cleaning measure for cleaning the substrate by use of a cleaning liquid, the substrate adhering to the support film covered with the protective film. The cleaning device can effectively clean a wafer supported by a dicing tape.

7 Claims, 9 Drawing Sheets

CLEANING DEVICE, CLEANING METHOD, AND COMPOSITION

This application claims priority under 35 U.S.C. §119(a)-(d) to Japanese Patent Application No. 2010-177988, filed Aug. 6, 2010, the entire contents of which are hereby incorporated by reference.

TECHNICAL FIELD

The present invention relates to a cleaning device and a cleaning method for cleaning a substrate adhering to a support film, and a composition for forming a protective film for use in the cleaning device and the cleaning method.

BACKGROUND ART

Devices such as mobile phone, digital AV apparatuses, integrated circuit cards, etc. have been improved to have higher performance, semiconductor silicon chips (hereinafter, refer to as chips) to be mounted in the devices consequently need to be smaller and thinner in order to greatly increase the number of chips mounted in packages of the devices. To greatly increase the number of chips mounted in the package, the chips needs to be thinned not more than 150 µm.

However, when semiconductor wafers (hereinafter, refer to as wafers) to be substrates of the chips are polished to a thin thickness, strength of the wafers are reduced. The thin wafers with weak strength are easy to be cracked or curved. Further, the thin wafers with weak strength are difficult to be transported by automatic transportation. This requires manual transportation, and thereby tedious handling.

To deal with this problem, a wafer support system has been developed to reinforce the strength of the wafers by adhering supporting plates (made from glass, rigid plastic, or the like) to the wafers before polishing. The wafer support system prevents cracking and curving of the wafers. The wafer support system, which reinforces the strength of the wafers, allows automatic transportation of the thin wafers.

The wafer and the supporting plate are adhered to each other via an adhesive tape, a thermoplastic resin, an adhesive, or the like. The supporting plate is stripped from the wafer before dicing. For example, in case where the wafer and the supporting plate are adhered to each other via an adhesive tape, the wafer can be torn off the supporting plate supporting plate. Meanwhile, in the case where the wafer and the supporting plate are adhered to each other via a thermoplastic resin, the thermoplastic resin is heated and dissolved so as to strip the wafer from the supporting plate. Further, in the case where the wafer and the supporting plate are adhered to each other via an adhesive, the adhesive is dissolved by use of a solution so as to strip from the wafer supporting plate adhering.

Further, an opposite surface of a surface adhering to the supporting plate of the wafer is sometimes adhered to a support such as a dicing tape in accordance with the film thickness of the wafer before the supporting plate is stripped from the wafer. Therefore, the wafer is supported by the dicing tape. Hence, the occurrence of a crack and the like can be reduced even if the film thickness of the wafer is thin and the strength thereof is low.

Further, as other examples of techniques for processing a wafer, Patent Literatures 1 and 2 disclose a laser processing for cutting a wafer into respective chips by irradiating a laser beam to the wafer in order to form the chips from the wafer. A protective film is formed on a surface of the wafer before the wafer is cut in order to prevent the wafer from receiving an influence of debris occurring when the wafer is cut by the laser during the laser processing.

CITATION LIST

Patent Literature

[Patent Literature 1] Japanese Patent Application Publication, Tokukai, No. 2004-188475 A (Publication Date: Jul. 8, 2004)

[Patent Literature 2] Japanese Patent Application Publication, Tokukai, No. 2004-322168 A (Publication Date: Nov. 18, 2004)

SUMMARY OF THE INVENTION

Contaminants sometimes adhere onto a surface of a wafer during a production process of the wafer, therefore the surface of the wafer needs to be cleaned by removing such adherents. When a supporting plate and the wafer are stripped from each other in the case where the supporting plate has adhered to the wafer via an adhesive, the adhesive and the like remain on the surface of the wafer in particular. Further, a post-dissolution residue resulting from fillers and the like in the adhesive also sometimes remains after the adhesive is dissolved. Therefore, the surface of the wafer needs to be cleaned in the state of being held by a dicing tape before the wafer is divided into the respective chips by dicing.

As an example of a method for cleaning a wafer, there is an automated process of the cleaning method as shown in FIGS. 10(a) and 10(b), so that the wafer can be cleaned effectively. FIGS. 10(a) and 10(b) show an example of the method for cleaning the surface of the wafer held by the dicing tape.

With this method, the adherents (such as a residual adhesive 103) and a post-dissolution residue 104 can be washed away and removed together from the wafer 100 by ejecting a cleaning liquid 106 onto a wafer 100 vigorously. As shown in FIG. 10(a), however, the adherents are flown onto a peripheral exposed surface of a dicing tape 101 having a larger surface area than the wafer 100, so that the exposed surface is contaminated by the post-dissolution residue 104. Under such circumstances, the post-dissolution residue 104 adhering to the dicing tape 101 often adheres to a dicing blade, to thereby contaminate the wafer 100 again in the subsequent dicing process.

Further, in order to prevent such contamination, the cleaning liquid is ejected while water is poured onto the dicing tape 101 in the method as shown in FIG. 10(b). However, in case where the water is ejected onto the dicing tape 101 in the state in which the large amount of residual adhesive 103 remains on the surface of the wafer 100, the water and the residual adhesive 103 sometimes react with each other and generate a precipitate 104. Note that, Patent Literatures 1 and 2 are silent regarding the contamination on the dicing tape during the cleaning of the wafer.

In view of this, there is a strong demand for development of a technique for cleaning effectively a wafer held (supported) by a dicing tape while preventing contamination on the dicing tape.

The present invention has been made in order to solve the aforementioned problems, and an object of the present invention is to provide a cleaning device, a cleaning method, and a composition for cleaning a wafer supported by a dicing tape effectively.

A cleaning device according to the present invention for cleaning a substrate adhering to a support film, includes:

protective film forming means for forming a protective film on an exposed surface of the support film, wherein the exposed surface is a portion of a surface of the support film to which a first surface of the substrate adheres, but the substrate does not adheres to the exposed surface; and cleaning means for cleaning the substrate by use of a cleaning liquid, the substrate adhering to the support film provided with the protective film.

A cleaning method according to the present invention for cleaning a substrate adhering to a support film, includes: a protective film forming step for forming a protective film on an exposed surface of the support film, wherein the exposed surface is a portion of a surface of the support film to which the first surface of the substrate adheres, but the substrate does not adheres to the exposed surface; and a cleaning step for cleaning the substrate by use of a cleaning liquid after the protective film forming step.

A composition according to the present invention for forming a protective film and for use in the cleaning device according to the present invention, includes a material insoluble in a cleaning liquid for cleaning a substrate.

A substrate such as a wafer supported by a support film such as a dicing tape can be cleaned effectively according to the present invention.

Other objects, features, and advantages of the present invention will become apparent sufficiently with reference to the description described below. Further, the advantages of the present invention will be evident in the following description.

DETAILED DESCRIPTION OF THE PREFERRED EMBODIMENTS

Hereinafter, an embodiment of the present invention will be described with reference to FIG. 1 and FIGS. 2(a) to 2(g).

In this embodiment, a wafer (substrate) adhered to a dicing tape serving as a support film is used as an object to be subjected to a cleaning process. The wafer is a substrate to which a circuit (element) is formed, and may be made of a conventionally known material such as a semiconductor.

The dicing tape is attached to one side (first surface) of the wafer in order to reinforce the strength of the wafer. For example, a dicing tape having a sticky layer on a base film can be used as the dicing tape. For example, a resin film made of polyvinyl chloride (PVC), polyolefin, polypropylene, or the like can be used as a material of the base film.

Further, the dicing tape is larger in size than an outer diameter of the wafer. Therefore, the dicing tape is extended peripherally beyond the wafer so as to peripherally have an exposed portion when the dicing tape and the wafer are attached to each other. Further, a dicing frame is provided further beyond the exposed surface of the dicing tape in order to prevent the dicing tape from being untensed.

In particular, this embodiment is preferably applicable for cleaning the wafer after a supporting plate that has held the wafer temporary during a production process of the wafer is stripped off.

Contaminants sometimes adhere onto a surface (second surface) of the wafer during the production process of the wafer, therefore the surface of the wafer needs to be cleaned by removing such adherents (adhered contaminants). In the case where the supporting plate has adhered to the wafer via an adhesive, the adhesive and the like remain in particular on the surface of the wafer when the supporting plate and the wafer are stripped from each other. Further, a post-dissolution residue derived from fillers and the like in the adhesive also sometimes remains after the adhesive is dissolved. Therefore, before the wafer is separated into the respective chips by dicing, the surface of the wafer needs to be cleaned in the state of being held by the dicing tape.

Note that, in the case where adherents such as a residual adhesive and the post-dissolution residue are washed away together and thereby removed from the wafer by ejecting the cleaning liquid onto the wafer, the post-dissolution residue adheres onto the exposed surface of the dicing tape having a larger surface area than the wafer, thereby resulting in contaminating the dicing tape. Further, some kinds of cleaning liquids for use in cleaning the wafer would deteriorate the dicing tape in the case where the cleaning liquid is brought into contact directly with the dicing tape.

The cleaning device according to this embodiment prevents such problems and performs the process preferably.

(Cleaning Device)

Figure 1:
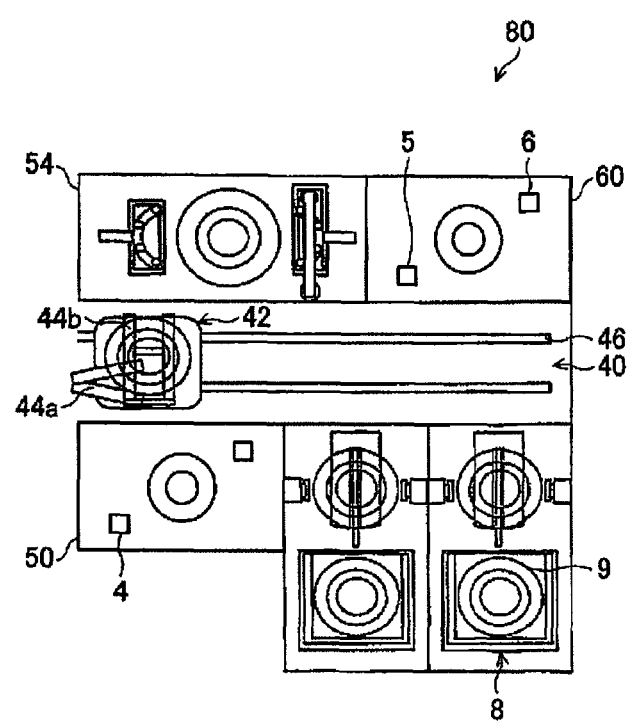
FIG. 1 is a top view showing a configuration of a cleaning device according to an embodiment of the present invention.

FIG. 1 is a top view showing a configuration of a cleaning device 80 according to an embodiment of the present invention.

As shown in FIG. 1, the cleaning device 80 includes a storage 8 for an object to be processed, conveying means 40, an applying unit 50 (for protective film), a stripping unit (stripping means) 54, and a removing unit 60. Further, the applying unit 50 includes protective film forming means 4, whereas the removing unit 60 includes first cleaning means (cleaning means) 5 and second cleaning means (removing means) 6. However, the cleaning device of the present invention may include a configuration other than the configuration of the cleaning device 80 exemplified herein.

The cleaning device 80 according to this embodiment performs a cleaning process on the wafer after stripping the supporting plate from the wafer, that is, the cleaning device 80 cleans the post-stripping wafer as an object 9.

The conveying means 40 conveys the object 9 to the applying unit 50 from the storage 8 in which the object 9 are stored.

The conveying means 40 conveys the object while holding the object 9. Further, the conveying means 40 conveys the object 9 from the applying unit 50 to the stripping unit 54 or the removing unit 60.

The conveying means 40 includes a conveying robot 42 and a guide way 46 for realizing a straight running. The conveying robot 42 is rotatable about a shaft of the conveying robot 42, and includes a connected arm 44a and hand 44b.

The connected arm 44a is bended and stretched by a rotating motion of its joint. The hand 44b is provided to an end of the connected arm 44a so as to hold the object 9 or the wafer. The conveying robot 42 can move the object 9 or the wafer within its horizontal plane through a bending and stretching motion of the connected arm 44a and the rotating motion rotating about the axis of the conveying robot 42.

The applying unit 50 forms a protective film on the object 9. Specifically, the protective film forming means 4 applies a material of the protective film to the exposed surface of the dicing tape holding the wafer.

The protective film forming means 4 may be configured to eject a liquid material through ejecting means such as a nozzle. However, a configuration of the protective film forming means 4 is not limited to such a configuration as to eject the liquid material as described above. For example, the protective film forming means 4 can employ such a configuration that a protective film formed into a film shape in advance is adhered to the object 9. Note that, a composition for forming the protective film will be described in detail below.

Further, for example, the applying unit 50 may be configured to irradiate ultraviolet light to the exposed surface of the dicing tape before applying the material of the protective film to the exposed surface. Such irradiation improves wettability of the dicing tape.

The stripping unit 54 strips the supporting plate from the wafer. The stripping unit 54 may be configured to be suitable for an adhesion layer interposed between the wafer and the supporting plate described below. For example, the stripping unit 54 may be configured to be capable of supplying a solvent for dissolving the adhesive or to be capable of irradiating light in order to decompose a reaction layer.

Note that, the stripping unit 54 may perform such process before or after the applying unit 50 forms the protective film.

The removing unit 60 cleans the object 9 and removes the protective film. Specifically, the first cleaning means 5 cleans the adherents adhering to the surface of the wafer, and the second cleaning means 6 removes the protective film formed on the dicing tape.

A configuration of the first cleaning means 5 is not limited thereto particularly as long as the first cleaning means 5 cleans the wafer by use of the cleaning liquid, and, for example, ejecting means such as a nozzle may be used.

The second cleaning means 6 is may be configured to be suitable for a material or a form of the protective film. For example, the second cleaning means 6 may be configured to eject the cleaning liquid such as water onto the protective film through ejecting and supplying means such as a nozzle, or may be configured to strip off the film.

Further, for example, the removing unit 60 may perform an additional dry processing and the like on the surface of the wafer after the cleaning (protective film removal) process by the second cleaning means 6. By performing the additional dry processing and the like, the surface of the wafer can be more clean even if adherents of the adhesive and the like cannot be removed completely by the first cleaning means 5. As an example of such processing, a plasma processing that removes the adhesive remaining on the surface of the wafer by generating oxygen plasma may be used.

Note that, for example, the applying unit 50 may be configured to rotate the object 9 during application of the material of the protective film by the protective film forming means 4. Similarly, the removing unit 60 may be configured to rotate the object 9 during processing of each of the first cleaning means 5 and the second cleaning means 6.

(Composition for Forming Protective Film)

A composition according to this embodiment is a composition for forming the protective film. The composition of this embodiment is not limited particularly as long as the composition is made of a material insoluble in the cleaning liquid, but the composition is preferably made of a water soluble material. As an example of such a material of the protective film, at least one kind of water soluble resin selected from acrylic resin, vinyl resin, cellulosic resin, and amide resin can be used.

Examples of an acrylic resin encompass a polymer or a copolymer made from a monomeric component such as acrylic acid, methyl acrylate, methacrylic acid, methyl methacrylate, N,N-dimethylacrylamide, N,N-dimethylaminopropyl methacrylamide, N,N-dimethylaminopropylacryl amide, N-methylacrylamide, diacetoneacrylamide, N,N-dimethylaminoethyl methacrylate, N,N-diethylaminoethyl methacrylate, N,N-dimethylaminoethyl acrylate, or acryloyl morpholin.

Examples of vinyl resin encompass a polymer or a copolymer made from a monomer such as N-vinylpyrrolidone, vinylimidazolidinone, or vinyl acetate, for example.

Examples of a cellulosic resin includes hydroxypropyl methylcellulose phthalate, hydroxypropyl methylcellulose acetate phthalate, hydroxypropyl methylcellulose hexahydrophthalate, hydroxypropyl methylcellulose acetate succinate, hydroxypropyl methylcellulose, hydroxypropyl cellulose, hydroxyethyl cellulose, cellulose acetate hexahydrophthalate, carboxymethylcellulose, ethyl cellulose, methylcellulose, or the like.

Furthermore, water-soluble amide resin can be used as a material of the protective film. Among these resins described above, the vinyl resin is used preferably, and polyvinyl pyrrolidone or polyvinyl alcohol is used preferably in particular.

These water soluble resins may be used alone or in combination of two or more thereof. A resin or resins are selected as the material of the protective film from among the aforementioned resins so that a value of an adhesive strength of the dicing tape after the protective film is formed becomes 50% or less, or more preferably 30% or less, in comparison with a value of the adhesive strength thereof before the protective film is formed.

Further, the composition for forming the protective film according to this embodiment can be used in various forms in accordance with the usage. For example, the composition in a liquid form may be applied to the exposed surface of the dicing tape, to thereby form the protective film. Further, a protective layer including the composition for forming any one of the aforementioned protective films may be formed on a film such as a flexible film in advance, and then is dried, thereby forming a protective film, which is then adhered to the exposed surface of the dicing frame.

(Cleaning Liquid)

The cleaning liquid is not limited particularly as long as the cleaning liquid includes a nonaqueous solvent, and, for example, a well-known cleaning liquid including a terpenoid solvent such as p-menthane described below can be used.

(Adhesive)

The adhesive is not limited particularly as long as the adhesive includes a resin having adhesiveness, and fillers may be included in the adhesive in addition to the resin.

Examples of a resin encompass gelatine, cellulose, cellulose ester (for example, cellulose acetate, cellulose nitrate), polyphenol, polyvinyl butyral, polyvinyl acetal, polycarbonate, polyurethane, polyester, polyorthoester, polyacetal, polyvinyl alcohol, polyvinylpyrrolidone, copolymer of vinylidene chloride and acrylonitrile, poly(meth)acrylate, polyvinyl chloride, a block copolymer containing silicone resin or polyurethane unit, or the like. These resins may be used alone or in combination of two or more thereof.

Examples of the fillers encompass silica, alumina, zinc oxide, titanium oxide, calcium oxide, magnesium oxide, iron oxide, tin oxide, antimony oxide, ferrite, calcium hydroxide, magnesium hydroxide, aluminium hydroxide, basic magnesium carbonate, calcium carbonate, zinc carbonate, barium carbonate, dawsonite, hydrotalcite, calcium sulfate, barium sulfate, calcium silicate, talc, clay, mica, montmorillonite, bentonite, sepiolite, imogolite, sericite, glass fiber, glass bead, silica-base balloon, aluminum nitride, boron nitride, silicon nitride, carbon black, graphite, carbon fiber, carbon balloon, zinc borate, various kinds of magnetic powders, and the like.

Further, the adhesive can be made by combining a resin and fillers by use of a well-known method. In this case, a solvent diluted with an organic solvent can be used as necessary.

Examples of the organic solvent encompass ketones such as acetone, methyl ethyl ketone, cyclohexanone, methyl isoamyl ketone, 2-heptanone, etc.; polyhydric alcohols and derivatives thereof such as ethylene glycol, ethylene glycol monoacetate, diethylene glycol, diethylene glycol monoacetate, propylene glycol, propylene glycol monoacetate, monomethyl ether including dipropylene glycol or dipropylene glycol monoacetate, monoethyl ether, monopropyl ether, monobutyl ether, monophenyl ether, etc.; cyclic ethers such as dioxane etc.; ester such as methyl lactate, ethyl lactate, methyl acetate, ethyl acetate, butyl acetate, methyl pyruvate, ethyl pyruvate, methyl methoxypropionate, ethyl ethoxypropionate, etc.; and terpenoid solvent, etc. These organic solvents may be used alone or in combination of two or more thereof.

Examples of the terpenoid solvent encompass α-pinene, camphene, pinane, myrcene, dihydromyrcene, p-menthane, 3-carene, p-menthadiene, α-terpinen, β-terpinen, α-phellandrene, ocimene, limonene, p-cymene, γ-terpinen, terpinolene, 1,4-cineole, 1,8-cineole, rose oxide, linalool oxide, fenchone, α-cyclocitral, ocimenol, tetrahydrolinalol, linalool, tetrahydro muguol, isopulegol, dihydrolinalool, isodihydrolavandulol, β-cyclocitral, citronellal, L-menton, linalyl formate, dihydroterpineol, β-terpineol, menthol, myrcenol, L-menthol, pinocarveol, α-terpineol, γ-terpineol, nopol, myrtenol, dihydrocarveol, citronellol, myrtenal, dihydrocarvone, d-pulegone, geranyl ethyl ether, geranyl formate, neryl formate, terpinyl formate, isodihydro lavandulyl acetate, terpinyl acetate, linalyl acetate, mycenyl acetate, bornyl acetate, menthyl propionate, linalyl propionate, nerol, carveol, perillylalcohol, geraniol, safranal, citral, perillaldehyde, citronellyloxyacetaldehyde, hydroxycitronellal, verbenone, d-carvone, L-carvone, piperitone, piperitenone, citronellyl formate, isobornyl acetate, menthyl acetate, citronellyl acetate, carvyl acetate, dimethyl octanyl acetate, neryl acetate, isopulegol acetate, dihydrocarvyl acetate, nopyl acetate, geranyl acetate, bornyl propionate, neryl propionate, carvyl propionate, terpinyl propionate, citronellyl propionate, isobornyl propionate, linalyl isobutyrate, neryl isobutyrate, linalyl butyrate, neryl butyrate, terpinyl butyrate, terpinyl butyrate, geranyl isobutyrate, citronellyl butyrate, citronellyl hexanoate, menthyl isovalerate, β-caryophyllene, cedrene, bisabolene, hydroxycitronellol, farnesol, rhodinyl isobutyrate, etc. Among these terpenoid solvent, the limonene and the p-menthane are used more preferably, and the p-menthane is used preferably in particular in terms of solubility.

Note that, the configuration of the adhesion layer interposed between the wafer and the supporting plate is not limited to the adhesive, and, for example, a reaction layer may be provided on the adhesive. For example, the light absorber decomposed by a laser light and the like may be included in the reaction layer. In this case, the method for stripping the wafer 1 from the supporting plate is not limited to dissolving the adhesive by use of the solvent, the wafer 1 and the supporting plate can be stripped from each other by irradiating light to the reaction layer and decomposing the reaction layer.

Examples of a light absorber encompass: particulate metal powders such as graphite powder, iron, aluminum, copper, nickel, cobalt, manganese, chromium, zinc, tellurium; metal oxide powders such as black titanium oxide; carbon black; or a dye or a pigment such as aromatic diamine-based metal complex, aliphatic diamine-based metal complex, aromatic dithiol-based metal complex, mercaptophenol-based metal complex, squarylium-based compound, cyanine-based pigment, methine-based pigment, naphthoquinone-based pigment, and anthraquinone-based pigment. Further, the light absorber may be formed into a film shape including a metal deposition film.

(Solvent)

The solvent for dissolving the adhesive is not limited thereto particularly. For example, the solvent may be: a straight-chain hydrocarbon such as hexane, heptane, octane, nonane, methyloctane, decane, undecane, dodecane, tridecane, a branched-chain $C_3$-$C_{15}$ hydrocarbon; or a cyclic hydrocarbon (terpenoid) such as a monoterpenoid, a diterpenoid etc. Examples of the monoterpeond encompass geraniol, nerol, linalool, citral, citronellol, p-menthane, o-menthane, m-menthane, diphenyl menthane, menthol, isomenthol, neomenthol, limonene, α-terpinen, β-terpinen, γ-terpinen, α-terpineol, β-terpineol, γ-terpineol, terpinen-1-ol, terpinen-4-ol, 1,4-terpin, 1,8-terpin, carvone, ionone, thujone, camphor, bornane, borneol, norbornane, pinane, α-pinene, β-pinene, thujane, α-thujone, β-thujone, calane, camphor, longifolene, 1,4-cineole, 1,8-cineole, etc. Examples of the diterpenoid encompass abietane, abietic acid, etc.

(Cleaning Method)

Figure 2:
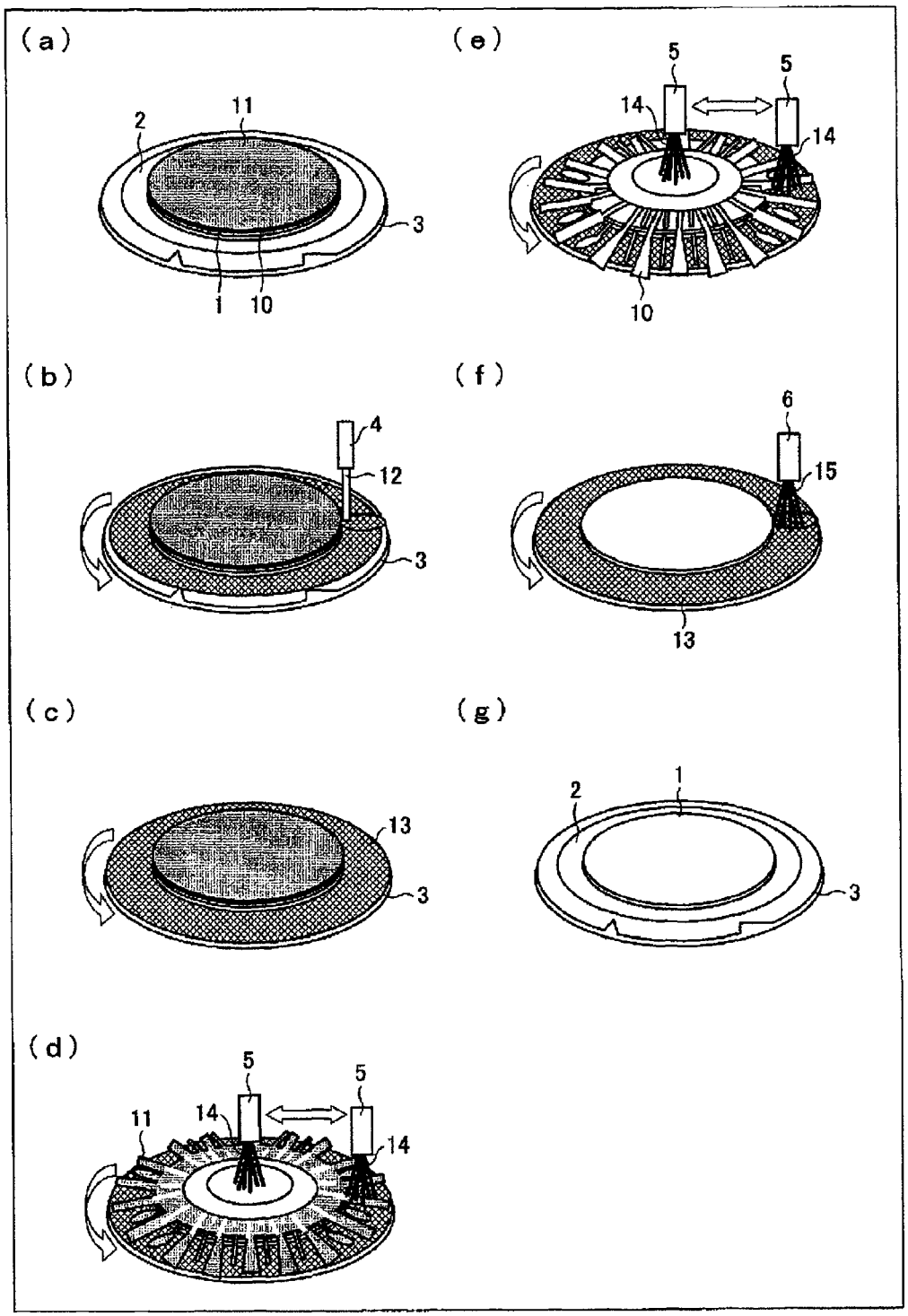
FIGS. 2(a) to 2(g) show a flow of a cleaning method according to the embodiment of the present invention.

Next, a cleaning method of an embodiment according to the present invention will be described with reference to FIGS. 2(*a*) to 2(*g*). FIGS. 2(*a*) to 2(*g*) show a flow of the cleaning method according to the embodiment of the present invention.

The wafer 1, which adheres to a dicing tape 2, after the supporting plate is stripped off is exemplified as the object in the cleaning method of this embodiment. The adherents such as the residual adhesive 10 of the adhesive and the post-dissolution residue 11 adhere onto the surface of the wafer 1 as shown in FIG. 2(*a*). Note that in the following process, description will be made in the case where the cleaning device 80 of this embodiment is used.

A material 12 of a protective film is supplied to the exposed surface of the dicing tape 2 in the cleaning method of this embodiment (FIG. 2(*b*)). A method for supplying the material 12 is not limited particularly, and, for example, the material 12 may be ejected through the protective film forming means 4 having a nozzle as shown in FIG. 2(*b*).

Note that, the material 12 may be supplied so as to cover at least the exposed surface of the dicing tape 2. Therefore, the present invention is not limited particularly by whether the material 12 covers the dicing frame 3 or not. Further, for example, the surface of the wafer 1 may be subjected to a masking process prior to supply of the material 12. Therefore, the wafer 1 is prevented from insufficient cleaning caused by forming the protective film on the surface of the wafer 1 to be cleaned Further, the object may be rotated during the supply of the material 12. This rotation spread the ejected material 12 all over the dicing tape 2 effectively. Further, ultraviolet light may be irradiated to the dicing tape before supplying the material 12 to the dicing tape 2. This irradiation improves wettability of the material 12 to the dicing tape.

The ejected material 12 is dried thereafter as shown in FIG. 2(c), a protective film 13 is formed (protective film forming step). The ejected material 12 may be dried by air drying, and, for example the object is dried while being rotated as shown in the allow of FIG. 2(c). Note that, a drying method is not limited thereto particularly. For example, the ejected material 12 may be dried by use of an oven, a hot plate, etc., or may be dried by blowing warm air thereto.

Next, the wafer 1 is cleaned by use of the cleaning liquid (cleaning step). A cleaning method of the wafer 1 is not limited particularly, and a cleaning liquid 14 may be ejected onto the wafer 1 through the first cleaning means 5 having a nozzle as shown in FIG. 2(d). In this way, the cleaning liquid 14 is ejected onto the wafer 1, therefore the post-dissolution residue 11 and the residual adhesive 10 can be washed away together and removed from the wafer 1 (FIG. 2(e)). Further, the object may be rotated during supply of the cleaning liquid. Therefore, the cleaning liquid 14 is expanded widely by the centrifugal force, so that the wafer 1 can be cleaned more effectively. During this cleaning, the cleaning liquid may be ejected while the nozzle is being rocked (swung).

After cleaning of the wafer 1, the protective film 13 formed on the dicing tape 2 is removed (FIG. 2(f)). A method for removing the protective film is not limited particularly. For example, the protective film 13 may be removed by ejecting water 15 onto the protective film 13 through the second cleaning means 6 having a nozzle and dissolving the protective film 13 in the case where the protective film 13 is made of water soluble material. After removal of the protective film 13, the object is dried (FIG. 2(g)). During such drying, the object may be rotated again.

Note that, the supporting plate is stripped off prior to the protective film forming step in this embodiment, but the present invention is not limited thereto, and, for example, the supporting plate may be stripped off after the protective film forming step.

According to the cleaning method of this embodiment as described above, adhering of the post-dissolution residue and the like can be prevented because the exposed surface of the dicing tape is protected during cleaning of the wafer. Hence, the wafer can be prevented from being contaminated by the adherents again in the subsequent dicing process and the like. Further, the cleaning liquid is not brought into contact with the dicing tape directly. Therefore the dicing tape is prevented from deteriorating, and, for example, a problem such as swelling of the dicing tape rarely occurs.

Note that, the adhesive and the like sometimes remain on an edge of the wafer 1 after the wafer 1 is cleaned by the aforementioned method, but an amount of these adhesives and the like is so small that the adhesive and the like do not inhibit the subsequent process. However, a step of removing a residual adhesive remaining on the edge of the wafer 1 may be performed as necessary. More specifically, for example, this step may be pouring, prior to drying of the object, the cleaning liquid to the edge of the wafer 1 while water is being poured to the exposed surface of the dicing tape 2, or this step may be removing, prior to drying of the object, the residual adhesive by a blade or a brush.

The present invention is not limited to the description of the embodiments above, but may be altered by a skilled person within the scope of the claims. That is, an embodiment based on a proper combination of technical means disclosed in different embodiments is encompassed in the technical scope of the present invention.

EXAMPLE

Example 1

Comparison of Adhesive Strength of Dicing Tape

Figure 3:
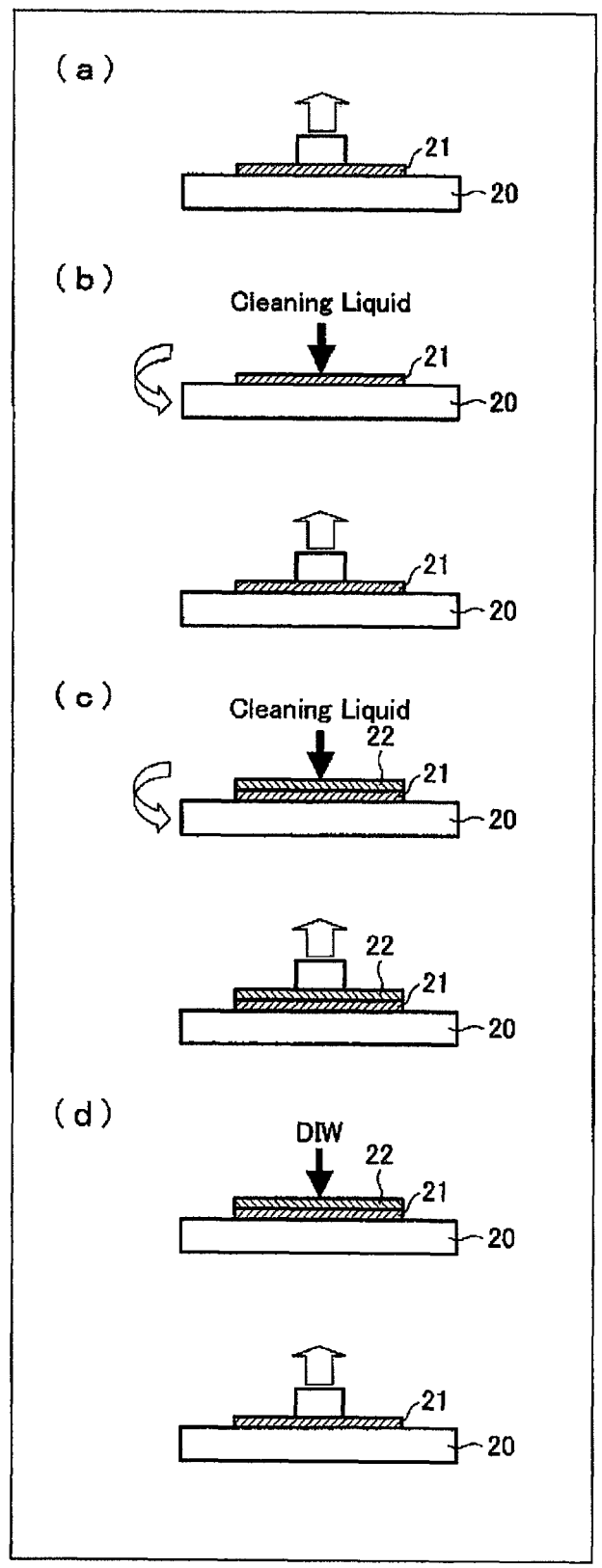
FIGS. 3(a) to 3(d) show how to measure the adhesive strength of dicing tapes in Example 1.

As shown in FIG. 3, the followings were prepared in Example 1: a dicing tape 21 held by a wafer 20, the dicing tape 21 having not being subjected to any process (FIG. 3(a)); a dicing tape 21 after the cleaning liquid was poured to the dicing tape 21 without the protective film being formed (FIG. 3(b)); a dicing tape 21 after the cleaning liquid was poured to the dicing tape 21 protected by a protective film 22 (FIG. 3(c)); and a dicing tape 21 after the protective film 22 thus formed was removed by water (FIG. 3(d)). Then, the adhesive strength of each of the dicing tapes was measured. FIG. 3 show how to measure the adhesive strength of each of the dicing tapes in Example 1.

Figure 4:
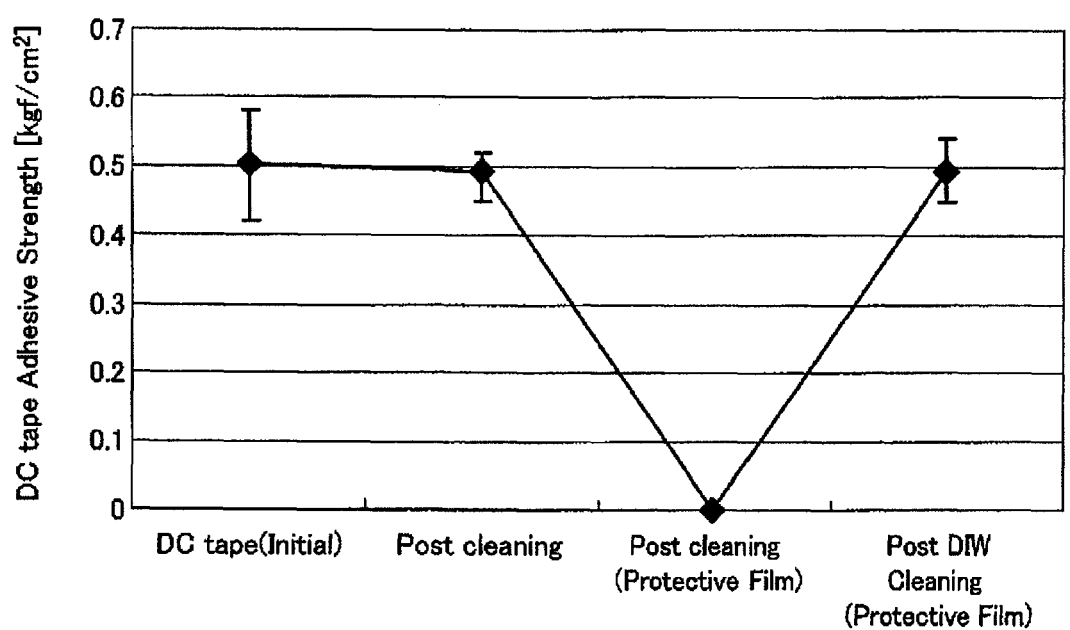
FIG. 4 is a graph showing a result of the measurement of the adhesive strength of the dicing tapes in Example 1.

Specifically, the dicing tape 21 in FIG. 3(b) was spin-cleaned for 5 minutes by use of the cleaning liquid (p-menthane) in a state in which a surface of the dicing tape 21 was exposed. After the protective film 22 (aqueous solution of polyvinyl alcohol (14% by mass)) was coated onto the surface of the dicing tape 21 in FIG. 3(c) (at 1000 rpm, for 3 minutes), the dicing tape 21 was spin-cleaned for 5 minutes by use of the cleaning liquid (p-menthane). Further, the protective film 22 formed on a surface of the dicing tape 21 in FIG. 3(d) was spin-cleaned by use of pure water (at 1000 rpm, for 30 seconds), therefore the protective film 22 was removed. Note that, the up-arrow in FIG. 3 indicates a state of measuring the adhesive strength. FIG. 4 is a graph showing a result of the measurement of the adhesive strength of each of the dicing tapes prepared for Example 1.

As is apparent from the graph of FIG. 4, the adhesive strength of the (initial) dicing tape that is not subjected to any process (DC tape (initial)), the adhesive strength of the dicing tape after pouring the cleaning liquid (Post cleaning), and the adhesive strength of the dicing tape after removing the protective film by use of water (Post DIW Cleaning (protective film)) were about 0.5 kgf/cm$^2$, respectively. Meanwhile, the adhesive strength of the dicing tape was reduced to 0 kgf/cm$^2$ after the cleaning liquid is poured to the dicing tape protected by the protective film (Post cleaning (protective film)).

Figure 5:
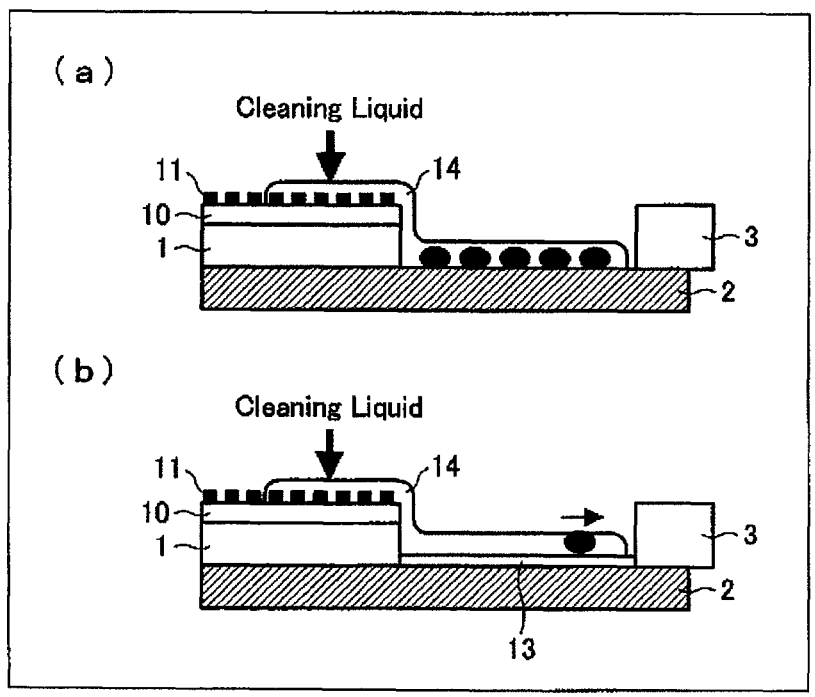
FIGS. 5(a) and 5(b) are views for comparison between a dicing tape with a protective film and a dicing tape without a protective film in Example 2 in terms of how much these dicing tapes swelled when a cleaning liquid is brought into contact with the dicing tapes.

From these results, for example, as the object to be processed that is to be used in the aforementioned embodiment, the following can be said as shown in FIG. 5: when the post-dissolution residue 11 remaining on the wafer 1 is cleaned in the state in which the exposed surface of the dicing tape 2 is not protected, the post-dissolution residue 11 adheres to the dicing tape 2 having stickiness, to thereby cause the contaminant (FIG. 5(a)); in the case where the exposed surface of the dicing tape 2 is protected, the post-dissolution residue 11 does not adhere to the dicing tape 2 having low adhesive strength, so that the post-dissolution residue 11 is washed away with the cleaning liquid even if the post-dissolution residue 11 is flown toward the dicing tape 2 by cleaning (FIG. 5(b)). FIGS. 5(a) and 5(b) are views for comparison between the case with the protective film and the case without the protective film in terms of how much post-dissolution residues are washed away.

Example 2

Comparison of Swelling of Dicing Tape

Figure 6:
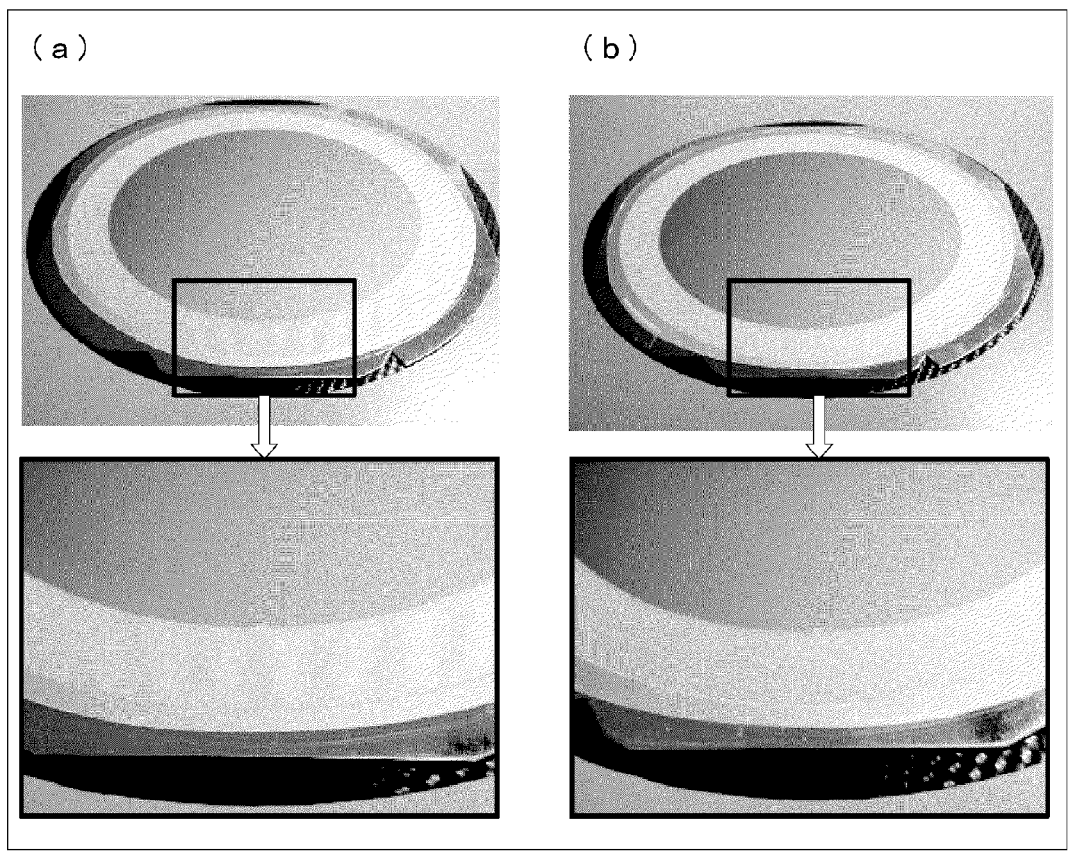
FIGS. 6(a) and 6(b) are views for comparison between the case with the protective film and the case without the protective film in terms of a how much post-dissolution residues are washed away.

When a cleaning liquid was brought into contact with the dicing tape in Example 2, a degree of swelling of a dicing tape in the case of providing a protective film was compared with that in the case of not providing a protective film. FIGS. 6(a) and 6(b) are views for comparison between a dicing tape with a protective film and a dicing tape without a protective film in Example 2 in terms of how much these dicing tapes swelled when a cleaning liquid is brought into contact with the dicing tapes.

As shown in FIG. 6(a), the dicing tape swelled in the case where the exposed surface of the dicing tape was not protected by the protective film. Meanwhile, as shown in FIG. 6(b), swelling of the dicing tape was able to be reduced in the case where the exposed surface of the dicing tape was protected by the protective film.

Example 3

Repeatability in Flowing of Fillers

Silicone resin powders ("KMP-701" (product name); particle size 3.5 μm, particle size distribution 1 μm to 6 μm, Shin-Etsu Chemical Co., Ltd.) which was a three-dimensional cross-linked product of fillers (polyorganosilsesquioxane $(RSi_{3/2})_n$) was applied to the wafer coated with the adhesive, and repeatability in flowing of the fillers with respect to the cleaning liquid was confirmed in Example 3. FIGS. 7(a) to 7(c) are views for showing confirmation of reproducibility of flowing of the fillers remaining on the adhesive.

Figure 7:
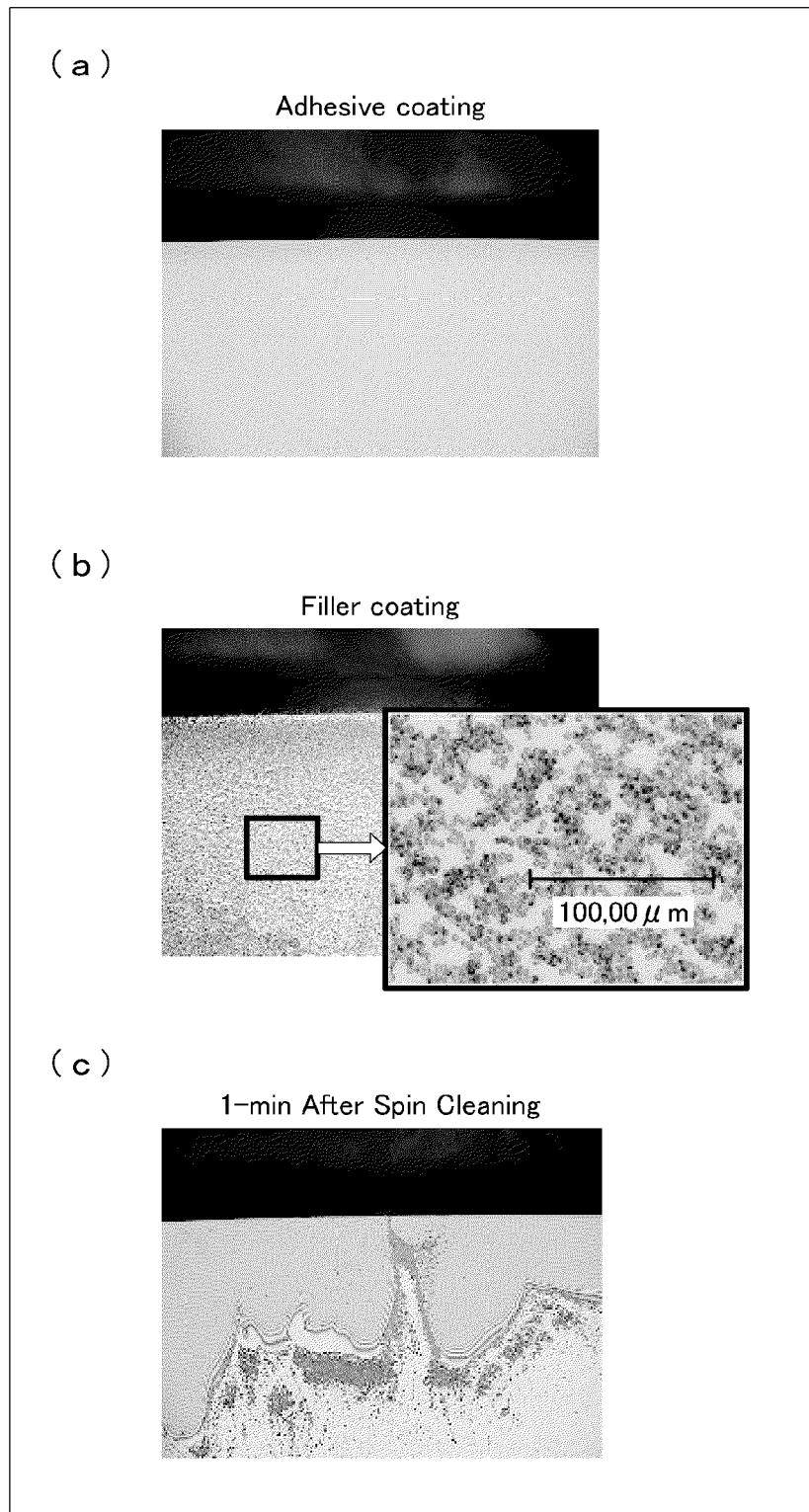
FIGS. 7(a) to 7(c) are views for showing confirmation of reproducibility of flowing of fillers remaining on an adhesive.

First, the fillers combined with thinner was spin-coated onto the wafer (FIG. 7(a)) coated with the adhesive as shown in FIG. 7 (FIG. 7(b)). The wafer of the surface was observed after the wafer was spin-cleaned for a minute by use of p-menthane. Then, it was confirmed that the fillers were washed away with the adhesive together as shown in FIG. 7(c).

Comparative Example 1

In Comparative Example 1, adherents remaining on a wafer was cleaned without a protective film being formed on a dicing tape. Specifically, an adhesive (TZNR (registered trademark)-A3003 (made by TOKYO OHKA KOGYO CO., LTD.), 20 μm) and silicone resin powders ("KMP-701" (product name); particle size 3.5 μm, particle size distribution 1 μm to 6 μm, made by Shin-Etsu Chemical Co., Ltd.) which was a three-dimensional cross-linked product of fillers (polyorganosilsesquioxane $(RSi_{3/2})_n$) were coated onto a surface of a wafer (6 inches, Bare (no BG)) which was supported by a dicing tape. P-menthane was ejected through the nozzle onto the object thus formed, so that the object was spin-cleaned at 2000 rpm for 5 minutes.

Figure 8:
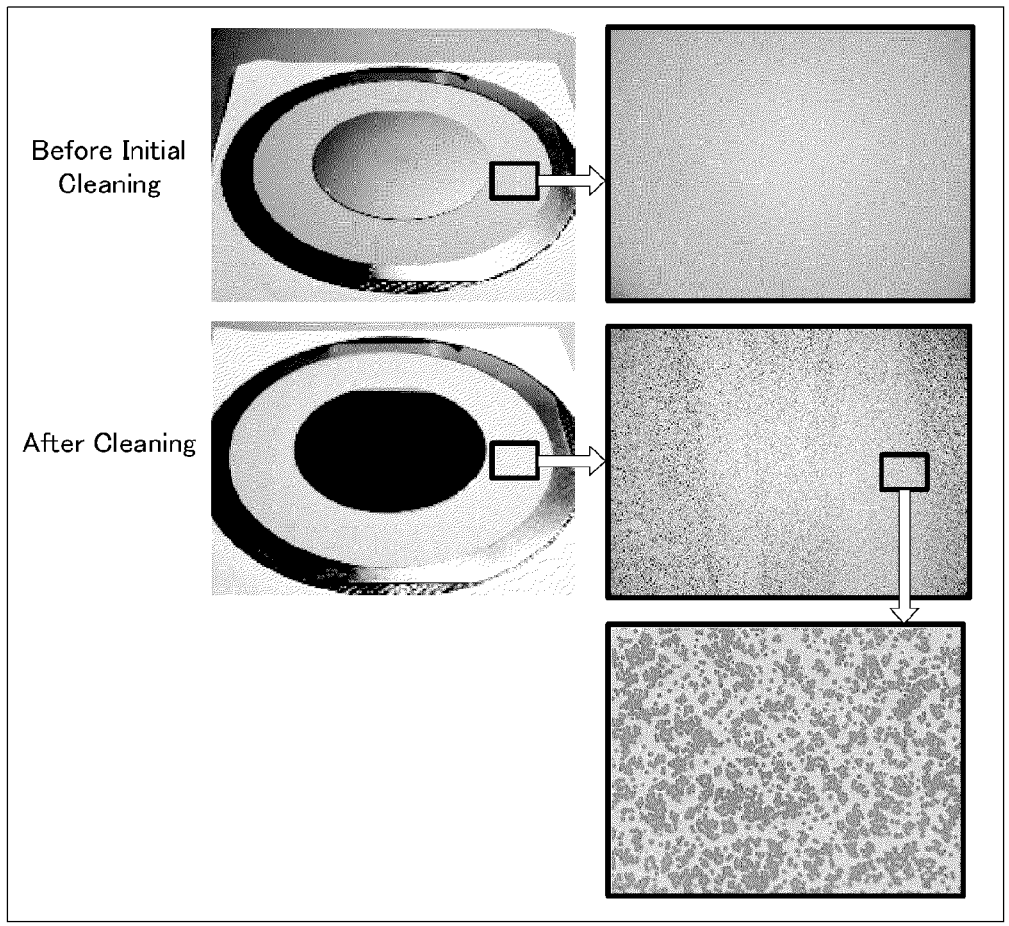
FIG. 8 is a view for comparison of adherence of adherents to the dicing tape before and after cleaning the wafer in Comparative Example 1.

As a result, as shown in FIG. 8, adherence of the adherents was not found on the dicing tape before cleaning, but adherence of the large amount of fillers was found on the dicing tape after cleaning. FIG. 8 is a view for comparison of adherence of adherents to the dicing tape before and after cleaning the wafer in Comparative Example 1. As is apparent from FIG. 8, the dicing tape is contaminated remarkably in the case where carbon black and the like are used as the fillers, for example. Further, the fillers adhering to the dicing tape was not be able to be removed by cleaning.

Example 4

In Example 4, the wafer was cleaned in the same way as in Comparative Example 1, except that the dicing tape was protected by the protective film. The protective film was formed by spin-coating an aqueous solution (14% by mass) containing polyvinyl alcohol (at 1000 rpm, for 2 minutes) onto the dicing tape.

Figure 9:
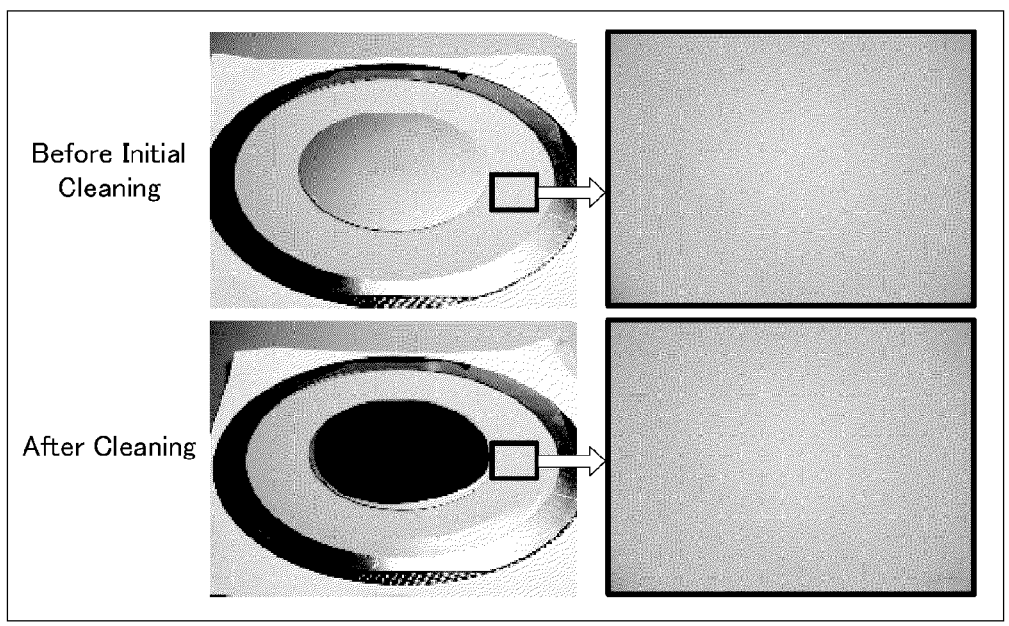
FIG. 9 is a view for comparison of adherence of adherents to the dicing tape before and after cleaning the wafer in Example 4.
Figure 10:
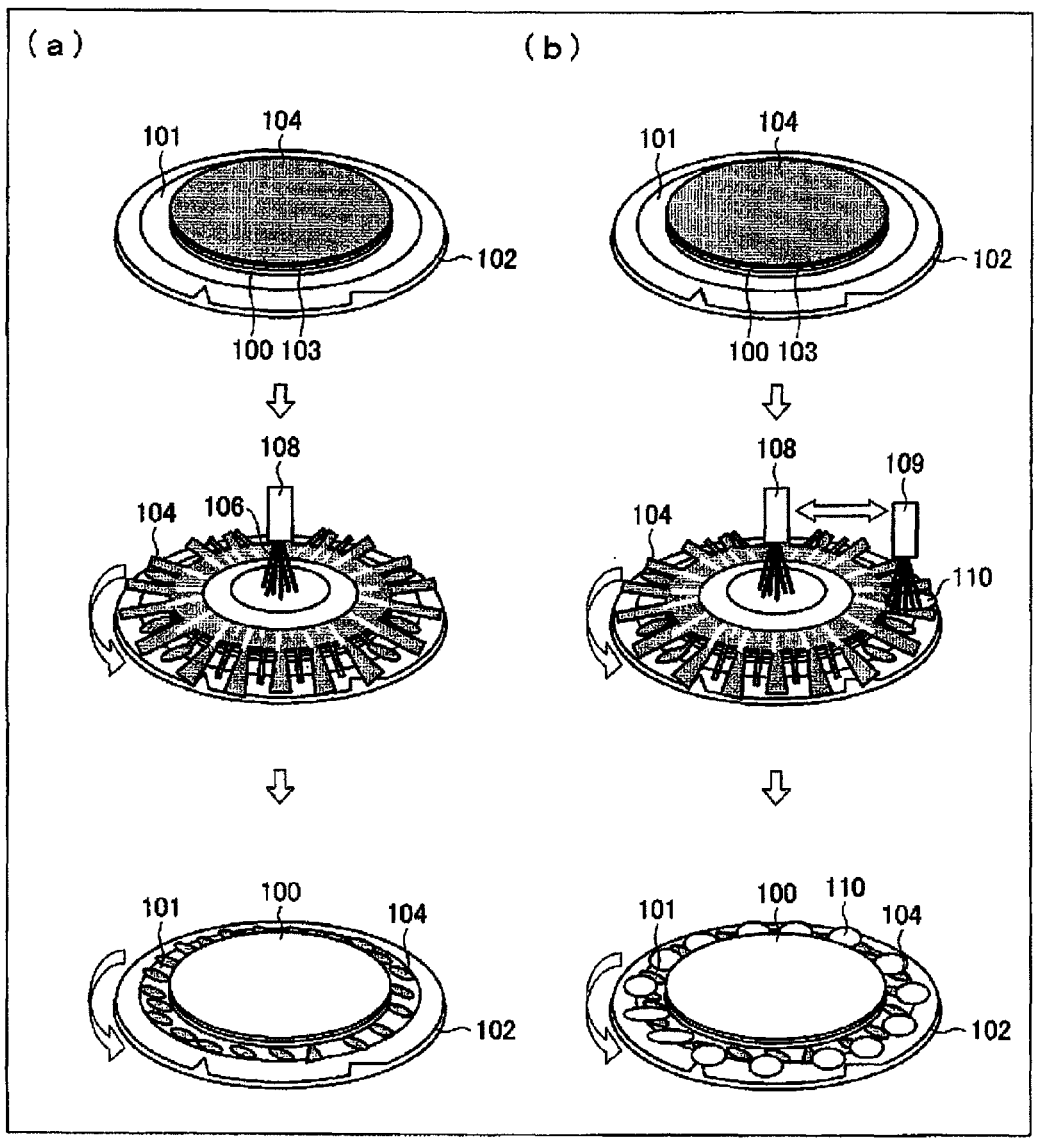
FIGS. 10(a) and 10(b) show an example of a conventional method for cleaning a surface of a wafer held by the dicing tape.

As a result, it was not found that the fillers adhere to the dicing tape after cleaning as shown in FIG. 9. FIG. 9 is a view for comparison of adherence of adherents to the dicing tape before and after cleaning the wafer in Example 4. Therefore, it was found that coating the protective film onto the dicing tape was effective for preventing contaminants from adhering to the dicing tape.

INDUSTRIAL APPLICABILITY

The present invention is preferably applicable to production process of a semiconductor wafer, for example.

REFERENCE SIGNS LIST

1 wafer
2 dicing tape
3 dicing frame
4 protective film forming means
5 first cleaning means (cleaning means)
6 second cleaning means (removing means)
8 storage for the object to be processed
40 conveying means
50 applying unit
54 stripping unit (stripping means)
60 removing unit
80 cleaning device

What is claimed is:

1. A cleaning device for cleaning a substrate adhering to a support film having an exposed surface and an unexposed surface, comprising:
   protective film forming means for forming a protective film on the exposed surface of the support film, wherein a first surface of the substrate adheres to the unexposed surface of the support film, but does not adheres to the exposed surface of the support film;
   cleaning means for cleaning the substrate with a cleaning liquid, wherein the substrate adheres to the support film provided with the protective film; and
   removing means for removing the protective film, wherein the removing means ejects water onto the protective film,
   the cleaning liquid includes a nonaqueous solvent, and
   the protective film is made of a material insoluble in the cleaning liquid and soluble in water, wherein the cleaning means is distinct from the removing means.

2. The cleaning device according to claim 1, further comprising:
   stripping means for stripping a supporting plate from the substrate, the substrate adhering via an adhesive to the supporting plate on a second surface of the substrate, wherein the second surface is opposite to the first surface, wherein the cleaning means removes adherents remaining on the substrate after the supporting plate is stripped from the substrate by the stripping means.

3. The cleaning device according to claim 1, wherein the cleaning means is configured to eject the cleaning liquid onto the substrate.

4. The cleaning device according to claim 1, wherein the protective film is made of a material insoluble in the cleaning liquid.

5. The cleaning device according to claim 1, further comprising removing means for removing the protective film.

6. A cleaning method for cleaning a substrate adhering to a support film having an exposed surface and an unexposed surface, comprising:

forming a protective film on the exposed surface of the support film, wherein a first surface of the substrate adheres to the unexposed surface of the support film, but does not adhere to the exposed surface of the support film; and cleaning the substrate with a cleaning liquid after the protective film forming step, wherein the cleaning liquid includes a nonaqueous solvent, and the protective film is made of a material insoluble in the cleaning liquid.

7. The cleaning method according to claim 6, further comprising:

stripping the support film from the substrate prior to cleaning, wherein the substrate adheres via an adhesive to the supporting plate on a second surface of the substrate, wherein the second surface is opposite to the first surface, wherein the cleaning removes adherents remaining on the substrate after the stripping.

* * * * *